United States Patent
Cho et al.

(10) Patent No.: US 10,002,940 B2
(45) Date of Patent: Jun. 19, 2018

(54) SPACER CHAMFERING GATE STACK SCHEME

(71) Applicants: INTERNATIONAL BUSINESS MACHINES CORPORATION, Armonk, NY (US); GLOBALFOUNDRIES INC., Grand Cayman (KY)

(72) Inventors: Hyun-Jin Cho, Guilderland, NY (US); Tenko Yamashita, Schenectady, NY (US); Hui Zang, Albany, NY (US)

(73) Assignees: INTERNATIONAL BUSINESS MACHINES CORPORATION, Armonk, NY (US); GLOBALFOUNDRIES INC, Grand Cayman (KY)

(*) Notice: Subject to any disclaimer, the term of this patent is extended or adjusted under 35 U.S.C. 154(b) by 0 days. days.

(21) Appl. No.: 15/363,563

(22) Filed: Nov. 29, 2016

(65) Prior Publication Data

US 2017/0077259 A1    Mar. 16, 2017

Related U.S. Application Data

(60) Continuation of application No. 15/208,121, filed on Jul. 12, 2016, now Pat. No. 9,646,969, which is a
(Continued)

(51) Int. Cl.
*H01L 29/51* (2006.01)
*H01L 27/092* (2006.01)
(Continued)

(52) U.S. Cl.
CPC ........ *H01L 29/512* (2013.01); *H01L 21/0262* (2013.01); *H01L 21/02532* (2013.01);
(Continued)

(58) Field of Classification Search
CPC ............. H01L 29/512; H01L 21/02532; H01L 21/0262; H01L 21/28088;
(Continued)

(56) References Cited

U.S. PATENT DOCUMENTS 8,507,979 B1    8/2013  Huang et al.
8,617,973 B2   12/2013  Xie et al.
(Continued)

OTHER PUBLICATIONS

List of IBM Patents or Patent Applications Treated as Related dated Nov. 29, 2016, 2 pages.

*Primary Examiner* — Yasser A Abdelaziez
(74) *Attorney, Agent, or Firm* — Tutunjian & Bitetto, P.C.; Vazken Alexanian

(57) ABSTRACT

A method of forming a gate structure for a semiconductor device that includes forming first spacers on the sidewalls of replacement gate structures that are present on a fin structure, wherein an upper surface of the first spacers is offset from an upper surface of the replacement gate structure, and forming at least second spacers on the first spacers and the exposed surfaces of the replacement gate structure. The method may further include substituting the replacement gate structure with a functional gate structure having a first width portion in a first space between adjacent first spacers, and a second width portion having a second width in a second space between adjacent second spacers, wherein the second width is greater than the first width.

14 Claims, 8 Drawing Sheets

Related U.S. Application Data division of application No. 14/735,984, filed on Jun. 10, 2015, now Pat. No. 9,613,958.

(51) Int. Cl.

| | |
|---|---|
| *H01L 29/78* | (2006.01) |
| *H01L 29/66* | (2006.01) |
| *H01L 29/49* | (2006.01) |
| *H01L 29/423* | (2006.01) |
| *H01L 21/8238* | (2006.01) |
| *H01L 21/02* | (2006.01) |
| *H01L 21/28* | (2006.01) |
| *H01L 27/12* | (2006.01) |

(52) U.S. Cl.
CPC ............. *H01L 21/28088* (2013.01); *H01L 21/823814* (2013.01); *H01L 21/823821* (2013.01); *H01L 21/823828* (2013.01); *H01L 21/823842* (2013.01); *H01L 21/823864* (2013.01); *H01L 27/0922* (2013.01); *H01L 27/0924* (2013.01); *H01L 27/1211* (2013.01); *H01L 29/4238* (2013.01); *H01L 29/42364* (2013.01); *H01L 29/42376* (2013.01); *H01L 29/4958* (2013.01); *H01L 29/4966* (2013.01); *H01L 29/6656* (2013.01); *H01L 29/66545* (2013.01); *H01L 29/66795* (2013.01); *H01L 29/785* (2013.01); *H01L 29/7851* (2013.01)

(58) Field of Classification Search
CPC ..... H01L 21/823814; H01L 21/823821; H01L 21/823828; H01L 21/823842; H01L 21/823864; H01L 27/0922; H01L 27/0924; H01L 27/1211; H01L 29/42364; H01L 29/42376; H01L 29/4238; H01L 29/4958; H01L 29/4966; H01L 29/66545; H01L 29/6656; H01L 29/66795; H01L 29/785; H01L 29/7851

See application file for complete search history.

(56) References Cited

U.S. PATENT DOCUMENTS

| | | | |
|---|---|---|---|
| 2005/0158935 A1* | 7/2005 | Shin | ................ H01L 21/28114 438/197 |
| 2013/0015532 A1 | 1/2013 | Kim et al. | |
| 2013/0187203 A1 | 7/2013 | Xie et al. | |
| 2013/0224944 A1 | 8/2013 | Khanna et al. | |
| 2013/0248985 A1 | 9/2013 | Amarnath et al. | |
| 2013/0295758 A1 | 11/2013 | Kim | |
| 2013/0299918 A1 | 11/2013 | Kim et al. | |
| 2013/0320414 A1 | 12/2013 | Fan et al. | |
| 2013/0328111 A1 | 12/2013 | Xie et al. | |
| 2014/0008720 A1 | 1/2014 | Xie et al. | |
| 2014/0024192 A1* | 1/2014 | Kim | ................ H01L 29/6653 438/296 |
| 2014/0145263 A1* | 5/2014 | Cheng | ............... H01L 21/76205 257/347 |
| 2015/0255570 A1* | 9/2015 | Basu | ................ H01L 29/6681 257/352 |
| 2015/0357440 A1 | 12/2015 | Cheng et al. | |
| 2016/0035725 A1 | 2/2016 | Pradhan et al. | |
| 2016/0163601 A1 | 6/2016 | Xie et al. | |

* cited by examiner

SPACER CHAMFERING GATE STACK SCHEME

BACKGROUND

Technical Field

The present disclosure relates to semiconductor devices, such as semiconductor devices including fin structures. The present disclosure further relates to processing of gate structures in fin including structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a gate structure for a semiconductor device is provided that includes forming first spacers on the sidewalls of replacement gate structures that are present on a fin structure, wherein an upper surface of the first spacers is offset from an upper surface of the replacement gate structure, and forming at least second spacers on the first spacers and the exposed surfaces of the replacement gate structure. In some embodiments, the method further includes substituting the replacement gate structure with a functional gate structure having a first width portion in a first space between adjacent first spacers, and a second width portion having a second width in a second space between adjacent second spacers, wherein the second width is greater than the first width.

In another aspect, the present disclosure provides a semiconductor device. In one embodiment, the semiconductor device may include a gate structure present on a channel portion of a fin structure, the gate structure including a first portion with a first width present on a gate dielectric, and a second portion with a second width present on the first portion, in which the second width is greater than the first width. The semiconductor device may further include a composite spacer. The composite spacer may further include a first portion of a first material in contact with the first portion of the gate structure, and a second portion of a second material in contact with the second portion of the gate structure.

In another aspect, the present disclosure provides a semiconductor device. The semiconductor device may include an n-type finFET and a p-type finFET. The n-type finFET includes a first gate electrode comprised of a titanium and carbon containing layer, a titanium and nitrogen containing layer and a tungsten fill present on a channel portion of a fin structure. The first gate electrode of the n-type finFET may include a first portion with a first width present on a gate dielectric, and a second portion with a second width present on the first portion, in which the second width is greater than the first width. The n-type finFET may further include a composite spacer including a first portion of a first material in contact with the first portion of the first gate electrode, and a second portion of a second material in contact with the second portion of the first gate electrode. The p-type finFET includes a second gate electrode comprised of a titanium and nitrogen containing layer and a tungsten fill present on a channel portion of a fin structure. The second gate electrode of the p-type finFET includes a first portion with a first width present on a gate dielectric, and a second portion with a second width present on the first portion, in which the second width is greater than the first width. The p-type finFET may further include a composite spacer including a first portion of a first material in contact with the first portion of the second gate electrode, and a second portion of a second material in contact with the second portion of the second gate electrode.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
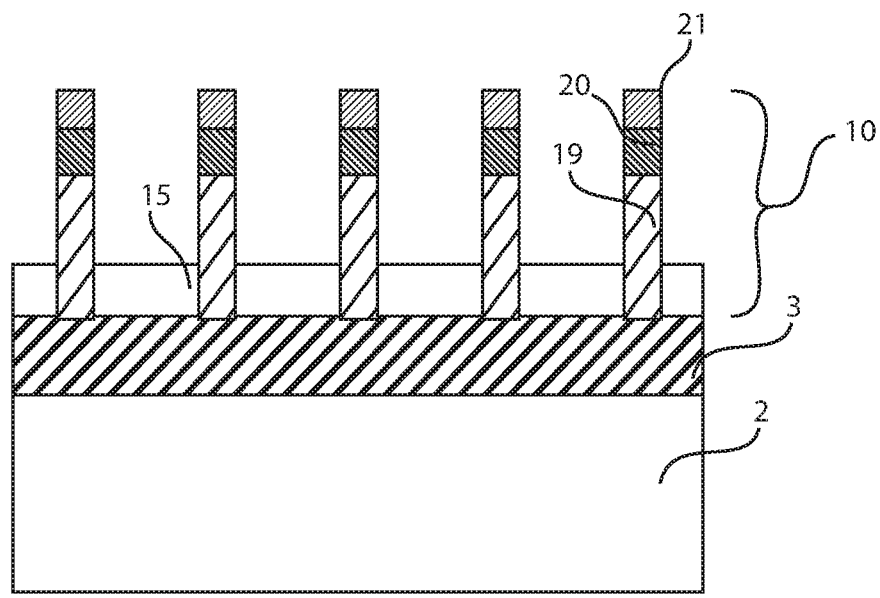
FIG. 1 is a side cross-sectional view that depicts forming a plurality of replacement gate structures on a fin structure, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the present disclosure provides a spacer forming process flow that can generate openings for replacement gate processing suitable for depositing work function metals for p-type and n-type semiconductor devices, as well as the metal fill material for gate electrodes. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor, i.e., whether a semiconductor device is p-type or n-type. For example, a semiconductor device having p-type source and drain regions is typically referred to as a p-type semiconductor device, and a semiconductor device having n-type source and drain regions is typically referred to as an n-type semiconductor device. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In some embodiments, FinFETs, such as those at the 14, 10 nm technology nodes, employ work-function metal chamfering process for desired threshold voltage (Vth). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure. In some examples, the nominal gate length (CD) of the FinFET can be on the order of 20 nm, which can make it challenging for chamfering processing of the work function adjusting layers, i.e., p-type work function metal layer and n-type work function metal layer, and subsequent metal fill process. Additionally, the width of the space that is provide by removing the replacement gate structure is greater at its base than at its opening, which can further complicate chamfering of the gate electrode. The methods and structures of the present disclosure are now discussed with more detail referring to FIGS. 1-14.

FIG. 1 depicts forming a plurality of replacement gate structures 10 on a fin structure 15. The fin structures 15 may be a plurality of silicon including fin structures that are formed from a semiconductor substrate 1. In some embodiments, the plurality of silicon including fin structures 1 may be formed from a semiconductor on insulator (SOI) substrate (as depicted in FIG. 1) or a bulk semiconductor substrate. Referring to FIG. 1, the SOI substrate that may provide the semiconductor substrate 1 may include at least a semiconductor on insulator (SOI) layer (which is processed to provide the fin structures 15) overlying a dielectric layer 3, in which a base semiconductor layer 2 may be present underlying the dielectric layer 3. The dielectric layer 3 may be referred to as a buried dielectric layer that can be composed of a nitride or oxide containing material. The base semiconductor layer 2 may be composed of the same semiconductor material, or of a different semiconductor material, than the SOI layer that provides the fin structures 15. It is noted that in some embodiments it is not required that the fin structures 15 be formed from an SOI substrate. For example, the dielectric layer 3 and the semiconductor layer that provides the fin structures 15 may be deposited on a bulk semiconductor substrate.

The fin structures 15 may be composed of a silicon containing material. For example, the fin structures 15 may be composed of a silicon containing material that may include, but is not limited to silicon, single crystal silicon, multicrystalline silicon, polycrystalline silicon, amorphous silicon, strained silicon, silicon doped with carbon (Si:C), silicon germanium, silicon alloys or any combination thereof. In one example, the fin structures 15 are composed of silicon (Si). The fin structures 15 may also be composed of other type IV semiconductors, such as germanium (Ge), and compound semiconductor materials, such as type III/V semiconductor materials.

The plurality of fin structures 15 may be formed from the semiconductor substrate 1, e.g., SOI substrate, using photolithography and etch processes. Prior to etching the semiconductor substrate 1 to provide the plurality of fin structures 15, a layer of the dielectric material can be deposited atop the SOI layer of the semiconductor substrate 1 to provide a dielectric fin cap 20. The material layer that provides the dielectric fin cap 20 may be composed of a nitride, oxide, oxynitride material, and/or any other suitable dielectric layer. The dielectric fin cap 20 may comprise a single layer of dielectric material or multiple layers of dielectric materials. The material layer that provides the dielectric fin cap 20 can be formed by a deposition process, such as chemical vapor deposition (CVD) and/or atomic layer deposition (ALD). Alternatively, the material layer that provides the dielectric fin cap 20 may be formed using a growth process, such as thermal oxidation or thermal nitridation. The material layer that provides the dielectric fin cap 20 may have a thickness ranging from 1 nm to 100 nm.

In one embodiment, following the formation of the layer of dielectric material that provides the dielectric fin cap 20, a photolithography and etch process sequence is applied to the material layer for the dielectric fin cap 20 and the portion of the semiconductor substrate 1 that provides the fin structures 15. Specifically, in one example, a photoresist mask 21 is formed overlying the layer of the dielectric material that provides dielectric fin cap 20, in which the portion of the dielectric material that is underlying the photoresist mask 21 provides the dielectric fin cap 20, and the portion of the SOI layer of the SOI substrate that is underlying the photoresist mask 21 provides the plurality of fin structures 15. The exposed portions of the dielectric material that provides dielectric fin cap 20, that is not protected by the photoresist mask 21, are removed using a selective etch process. The selective etch process may be a directional etch, anisotropic etch, such as reactive ion etching (RIE). Following patterning of the dielectric fin cap 20, at least a portion of the substrate 1 is etched to form the plurality of fin structures 15.

Each of the fin structures in the plurality of fin structures 15 may have a height ranging from 5 nm to 200 nm. In another embodiment, each of the plurality of fin structures 15 has a height ranging from 10 nm to 100 nm. In one example, each of the plurality of fin structures 15 has a height ranging from 20 nm to 50 nm. Each of the plurality of fin structures 15 may have a width of less than 20 nm. In another embodiment, each of the plurality of fin structures 15 has a width ranging from 3 nm to 8 nm. The pitch separating adjacent fin structures in the plurality of fin structures 15 may range from 10 nm to 500 nm. In another example, the pitch separating adjacent fin structures in the plurality of fin structures 15 is 60 nm.

A plurality of replacement gate structures 10 are present on the fin structures 15. As used herein, the term "replacement gate structure 10" denotes a sacrificial structure that dictates the geometry and location of the later formed functioning gate structure. The "functional gate structure" functions to switch the semiconductor device from an "on" to "off" state, and vice versa. In one embodiment, the replacement gate structure 10 includes an interfacial dielectric material (not shown), and a sacrificial gate material 19. In one embodiment, the sacrificial material that provides the sacrificial gate material 19 may be composed of any material that can be etched selectively to the at least one fin structure 15. In one embodiment, the sacrificial gate material 19 may be composed of a silicon-including material, such as polysilicon. In another embodiment, the sacrificial gate material 19 may be composed of a dielectric material, such as an oxide, nitride or oxynitride material, or amorphous carbon. The sacrificial gate material 19 may be formed using deposition (e.g., chemical vapor deposition) photolithography and etch processes (e.g., reactive ion etching). Although FIG. 1 depicts five replacement gate structures 10, the present disclosure is not limited to only this example. In some embodiments, the pitch, i.e., center to center distance, separating adjacent replacement gate structures 15 may range from 20 nm to 10 nm.

Figure 2:
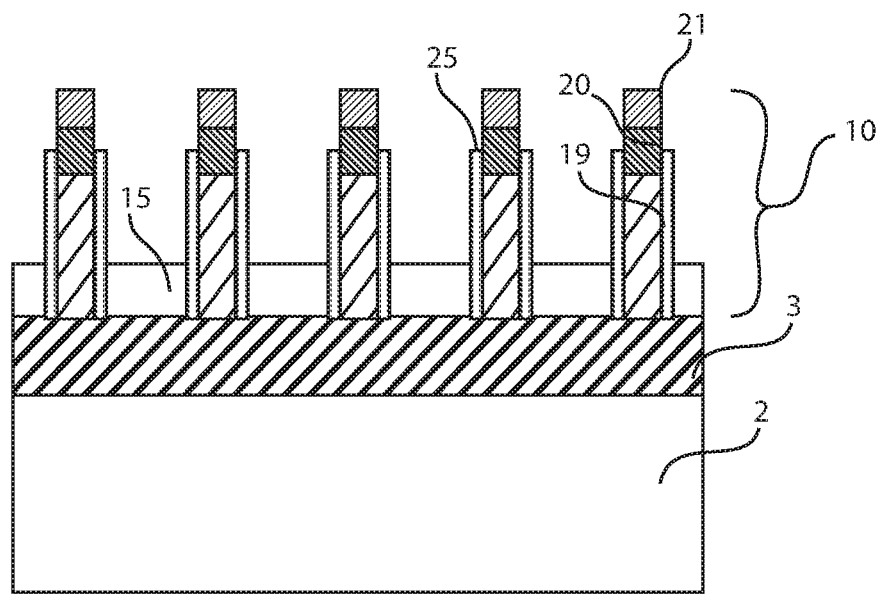
FIG. 2 is a side cross-sectional view that depicts forming first spacers on the sidewalls of replacement gate structures that are present on a fin structure, in accordance with one embodiment of the present disclosure.

FIG. 2 depicts one embodiment of forming first spacers 25 on the sidewalls of replacement gate structures 10 that are present on the fin structures 15. Forming the first spacers 25 may begin with depositing a first dielectric layer using a deposition process, such as chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The first dielectric layer is typically a conformal layer. The term "conformal" denotes a layer having a thickness that does not deviate from greater than or less than 30% of an average value for the thickness of the layer. The first dielectric layer may be composed of a nitride containing dielectric, such as silicon nitride, an oxide containing dielectric, such as silicon oxide, or a combination thereof. In one example, the first dielectric layer that is processed to provide the first spacers 25 is composed of silicon carbon boron nitride (SiCBN). In one embodiment, the thickness of the first dielectric layer typically ranges from 4 nm to 20 nm. In another embodiment, the thickness of the first dielectric layer ranges from 4 nm to 10 nm.

Following the deposition of the first dielectric layer, an etch process may be employed to remove the horizontal portions of the first dielectric layer, wherein the remaining vertical portions of the first dielectric layer provide the first spacers 25. The first spacers 25 are present in direct contact with the sidewalls of the sacrificial gate structure 10. The horizontal portions of the first dielectric layer can be removed from the fin structures 15 and the upper surface of the dielectric layer 2 of the substrate 1. The horizontal portions of the first dielectric layer may be removed by an anisotropic etch process, such as reactive ion etching (RIE). As used herein, an "anisotropic etch process" denotes a material removal process in which the etch rate in the direction normal to the surface to be etched is greater than in the direction parallel to the surface to be etched. Other examples of anisotropic etching that can be used at this point of the present invention include ion beam etching, plasma etching or laser ablation.

In some embodiments, the width of the first spacers 25 may range from 2 nm to 25 nm, as measured from the sidewall of the sacrificial gate structure 10. In another embodiment, the width of the first spacers 25 may range from 4 nm to 10 nm, as measured from the sidewall of the sacrificial gate structure 10.

Figure 3:
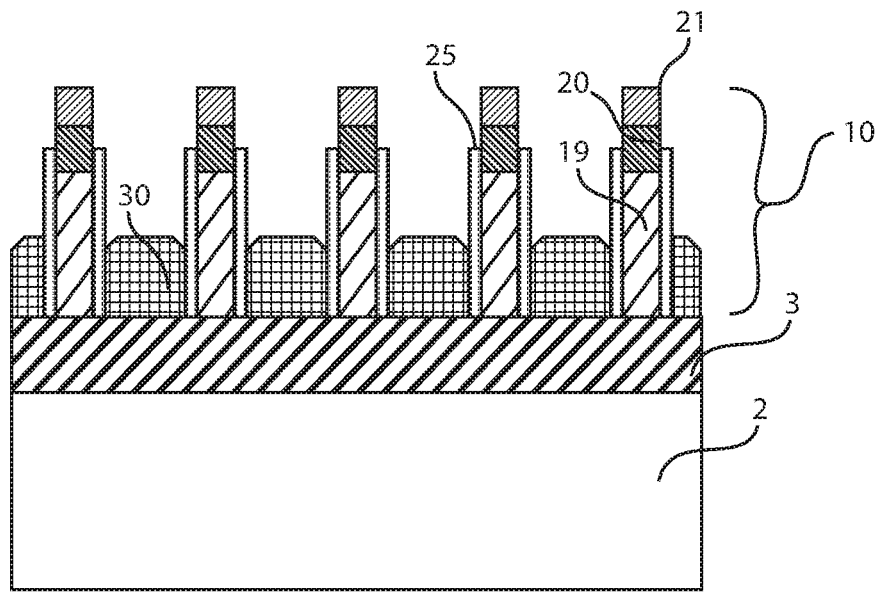
FIG. 3 is a side cross-sectional view that depicted forming a semiconductor material on the source and drain region portions of the fin structures, in accordance with one embodiment of the present disclosure.

FIG. 3 depicts forming a semiconductor material 30 on the source and drain region portions of the fin structures 15. The semiconductor material 30 may be epitaxially formed and may be in situ doped with an n-type or p-type dopant, and may provide at least one doped portion of the source and drain regions of the FinFETs. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The terms "epitaxial growth and/or deposition" and "epitaxially formed" mean the growth of a material, such as a semiconductor or dielectric, on a deposition surface of a semiconductor material, in which the material being grown has the same crystalline characteristics as the semiconductor material of the deposition surface. A material referred to as being an "epitaxial" material is a material formed using an epitaxial deposition process, and has the same crystalline structure as the material the epitaxial material is formed on. Epitaxial deposition may also provide a selective deposition process, as the epitaxially deposited semiconductor material may only be formed on other semiconductor materials, e.g., the epitaxial material is not formed on dielectric surfaces. By "in-situ" it is meant that the dopant that dictates the conductivity type of the epitaxially formed in situ doped source and drain region structures 30a, 30b is introduced during the process step, e.g., epitaxial deposition, which forms the epitaxially formed in situ doped source and drain region structures 30a, 30b.

In some embodiments, the epitaxial semiconductor material 30 that is formed on the source and drain portions of the fin structures 15 for p-type FinFETs is silicon germanium. In some embodiments, the epitaxial semiconductor material 30 that is formed on the source and drain portions of the fin structures 15 for n-type FinFETs is silicon. A number of different sources may be used for the deposition of the semiconductor material that forms the raised source/drain regions 36. In some embodiments, in which the epitaxial semiconductor material 30 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which epitaxial semiconductor material 30 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

In some embodiments, the epitaxially formed in situ doped semiconductor material 30 is merging source and drain region structures, in which a single continuous portion of in situ doped epitaxial semiconductor material are in direct contact with the source and drain region portions of adjacent fin structures 15. Embodiments have also been contemplated in which the epitaxial semiconductor material on the source and drain region portions of the fin structures in an n-type device region are separated from the epitaxial semiconductor material on the source and drain region portions of the fin structures in a p-type device region. In some examples, this may be referred to as source and drain regions that are composed of unmerged epitaxy.

In some embodiments, the extension source and drain regions may be formed after the epitaxially formed in situ doped semiconductor material 30 is positioned on the source and drain region portions of the fin structures 15 by thermally diffusing the n-type or p-type dopant from the epitaxially formed in situ doped semiconductor material 30 into the underlying portion of the fin structures 15. In some embodiments, the source and drain regions are activated by a high temperature anneal.

Figure 4:
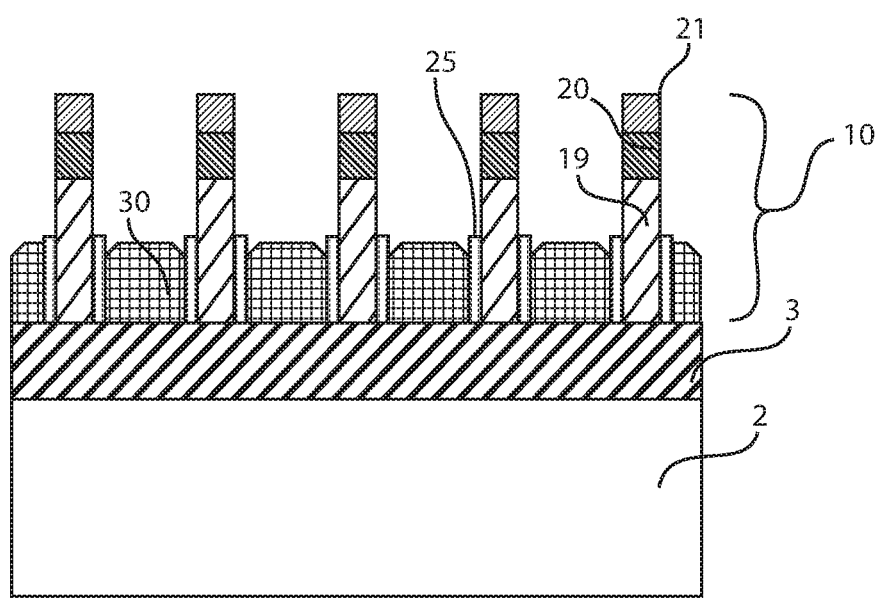
FIG. 4 is a side cross-sectional view depicting recessing the first spacers, in accordance with one embodiment of the present disclosure.

FIG. 4 depicts recessing the first spacers 25. The first spacers 25 may be recessed using an anisotropic etch process. Examples of anisotropic etching that can be used at this point of the present disclosure include reactive ion etching, ion beam etching, plasma etching or laser ablation. The etch process for recessing the first spacers 25 may include a selective etch chemistry that does not substantially etch at least the semiconductor material 30. In some embodiments, following recessing, the first spacers 25 may have a height, i.e., recessed height, ranging from 5 nm to 35 nm, as measured from the upper surface of the dielectric layer 3. In some embodiments, following recessing, the first spacers 35 may have a height, i.e., recessed height, ranging from 10 nm to 30 nm, as measured from the upper surface of the dielectric layer 3. The height, i.e., recessed height, of the first spacer 25 is typically approximate to the height of the upper surface of the semiconductor material 30. The portion of the sidewall of the replacement gate structure 10 that the first spacer 25 is in contact with may be referred to as the lower portion of the replacement gate structure 10.

Figure 5:
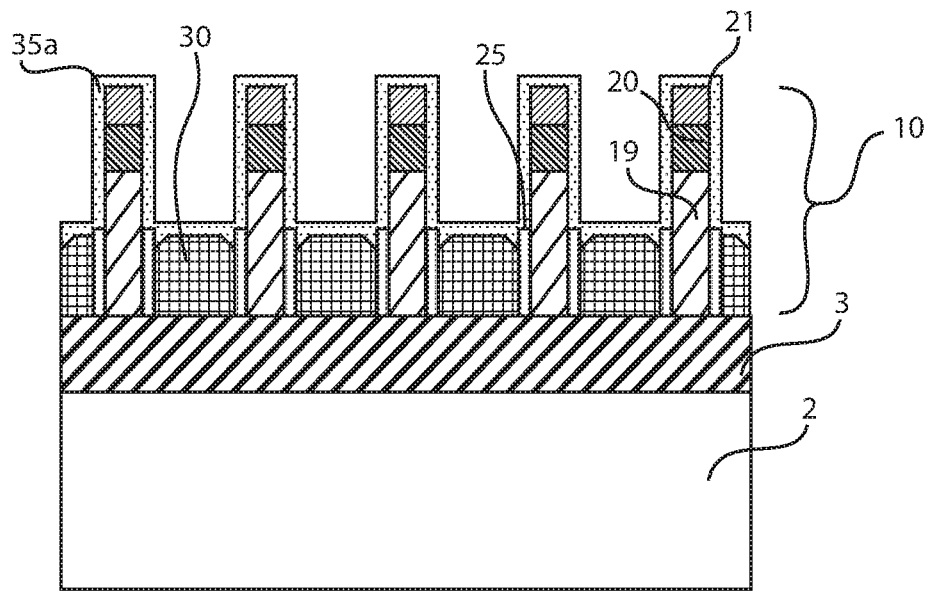
FIG. 5 is a side cross-sectional view depicting depositing a conformal oxide layer, in accordance with one embodiment of the present disclosure.
Figure 6:
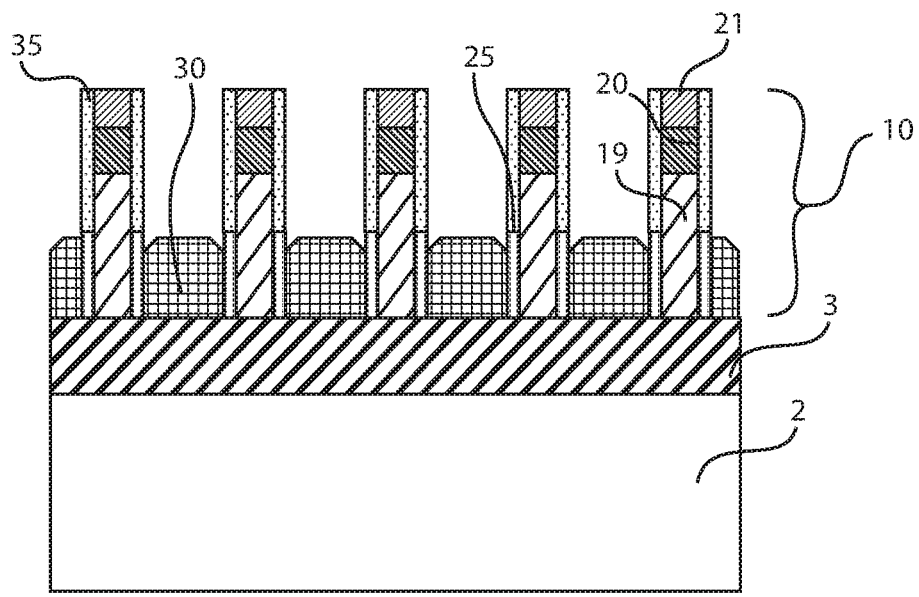
FIG. 6 is a side cross-sectional view depicting removing the horizontal surfaces of the conformal oxide layer, in accordance with one embodiment of the present disclosure.

FIGS. 5 and 6 depict one embodiment of forming a second spacer 35 on an upper portion of the replacement gate structure 10. The second spacer 35 is typically composed of an oxide containing dielectric. For example, the second spacer 35 may be composed of silicon oxide, aluminum oxide, silicon oxynitride, hafnium oxide or a combination thereof. In one example, when the first spacer 25 is composed of silicon carbon boron nitride (SiBCN), the second spacer 35 may be composed of silicon oxide ($SiO_2$). It is noted that this is only one example of a material that is suitable for the second spacer 35. The second spacer 35 may be composed of any dielectric material that provides that the replacement gate structure 10 can be removed using a selective etch process.

In some embodiments, forming the second spacer 35 may begin with depositing a conformal second dielectric layer 35a on the replacement gate structures 10, as depicted in FIG. 5. The second dielectric layer 35a can be formed using a chemical vapor deposition (CVD) process, which can include atmospheric pressure CVD (APCVD), low pressure CVD (LPCVD), plasma enhanced CVD (PECVD), metal-organic CVD (MOCVD) and combinations thereof. The second dielectric layer 35a is typically composed of an oxide containing dielectric, such as silicon oxide, but other dielectric materials may be equally suitable, such as nitrides and oxynitrides. In one embodiment, the thickness of the second dielectric layer 35a typically ranges from 4 nm to 20 nm. In another embodiment, the thickness of the second dielectric layer 35a ranges from 4 nm to 10 nm.

Following the deposition of the second dielectric layer 35a, an etch process may be employed to remove the horizontal portions of the second dielectric layer 35a, wherein the remaining vertical portions of the second dielectric layer 35a provide the second spacers 35, as depicted in FIG. 6. The second spacers 35 are present in direct contact with the upper sidewalls of the sacrificial gate structure 10. The horizontal portions of the second dielectric layer can be removed from the semiconductor material 30 by an anisotropic etch process, such as reactive ion etching (RIE). Other examples of anisotropic etching that can be used at this point of the present disclosure include ion beam etching, plasma etching or laser ablation.

In some embodiments, the width of the second spacers 35 may range from 4 nm to 20 nm, as measured from the sidewall of the sacrificial gate structure 10. In another embodiment, the width of the second spacers 35 may range from 4 nm to 10 nm, as measured from the sidewall of the sacrificial gate structure 10.

Figure 7A:
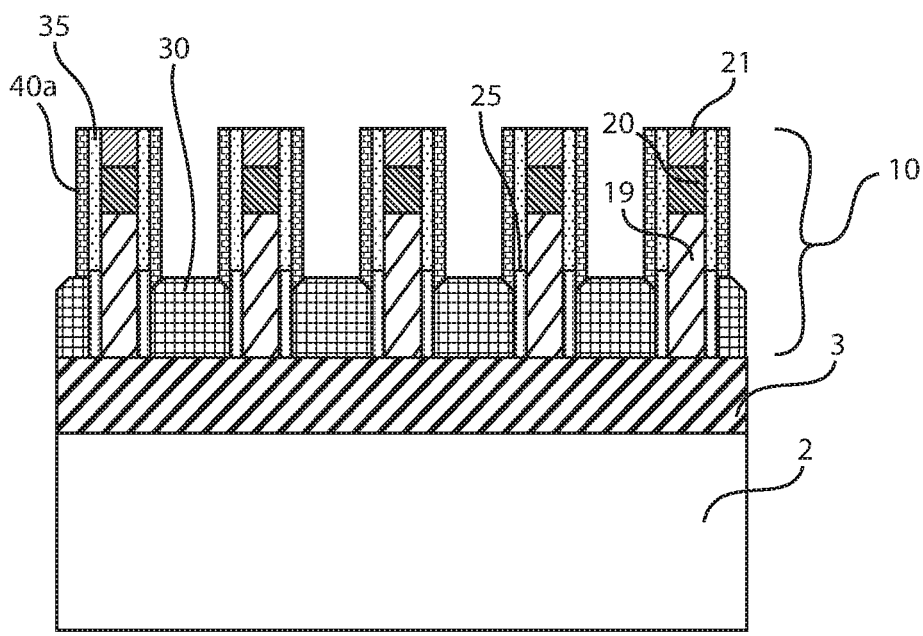
FIG. 7A is a side cross-sectional view depicting forming a conformal nitride layer on the structure depicted in FIG. 6, and removing the horizontal surfaces of the conformal nitride layer, in accordance with one embodiment of the present disclosure.
Figure 7B:
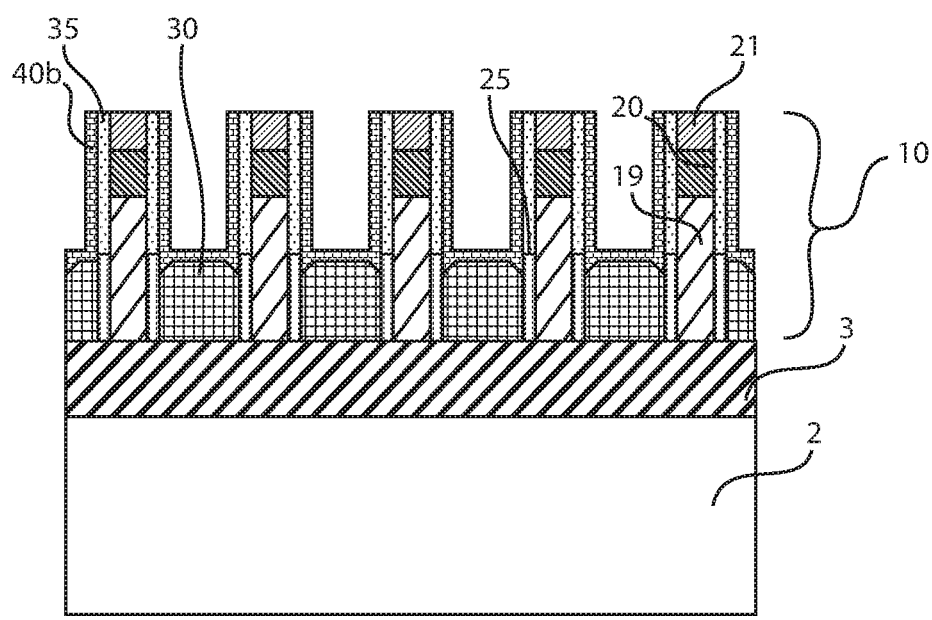
FIG. 7B is a side cross-sectional view depicting forming a conformal nitride layer on the structure depicted in FIG. 6, in which the horizontal surfaces of the conformal nitride layer are not removed from the structure, in accordance with another embodiment of the present disclosure.

FIGS. 7A and 7B depict forming a third spacer 40a, 40b on the structure depicted in FIG. 6. In the embodiment that is depicted in FIG. 7A, the third spacer 40a is only present on the sidewall of the second spacer 35, and optionally the sidewall of the first spacer 25. In the embodiment depicted in FIG. 7B, the third spacer 40b includes a first portion, i.e., vertically orientated portion, that is present along substantially an entirety of the sidewall of the second spacer 35, and includes a second portion, i.e., horizontally orientated portion, that extends over the upper surface of the semiconductor material 30.

In one embodiment, the third spacer 40a is formed by conformally depositing a third dielectric layer on the structure depicted in FIG. 6 followed by an anisotropic etch to remove the horizontal portions of the third dielectric layer, wherein the vertical portions of the third dielectric layer remain on the sidewalls of the second spacer 35 to provide the third spacer 40a. The third dielectric layer is typically a conformal layer that is formed using a chemical vapor deposition process, such as atmospheric pressure CVD (APCVD), low pressure CVD (LPCVD), plasma enhanced CVD (PECVD), metal-organic CVD (MOCVD) and combinations thereof. The third dielectric layer may be composed of a nitride. For example, when the first spacer 25 is composed of silicon boron carbon nitride (SiBCN), and the second spacer 35 is composed of silicon oxide ($SiO_2$), the third dielectric layer that provides the third spacer 40a may be silicon nitride ($Si_3N_4$). Following deposition, the third dielectric layer may be etched with an anisotropic etch, such as reactive ion etch (RIE), ion beam etching, plasma etching or laser ablation, to remove the horizontal portions, as depicted in FIG. 7A. The third dielectric layer may be deposited to a thickness to provide a third spacer 40a having a width ranging from 4 nm to 20 nm, and in some embodiments ranging from 4 nm to 10 nm, as measured from the sidewall of the sacrificial gate stack 10. FIG. 7B depicts another embodiment of the third spacer 35b in which the horizontal portions of the third dielectric layer where not remove. To provide this embodiment of the third spacer 35b, the anisotropic etch step is omitted from the process sequence described with reference to FIG. 7A. It is noted that although the remainder of the process flow, e.g., FIGS. 8-9, that are described herein includes the embodiment of the third spacer 40a that is depicted in FIG. 7A, the third spacer 40b depicted in FIG. 7B is equally applicable to the following description.

Figure 8:
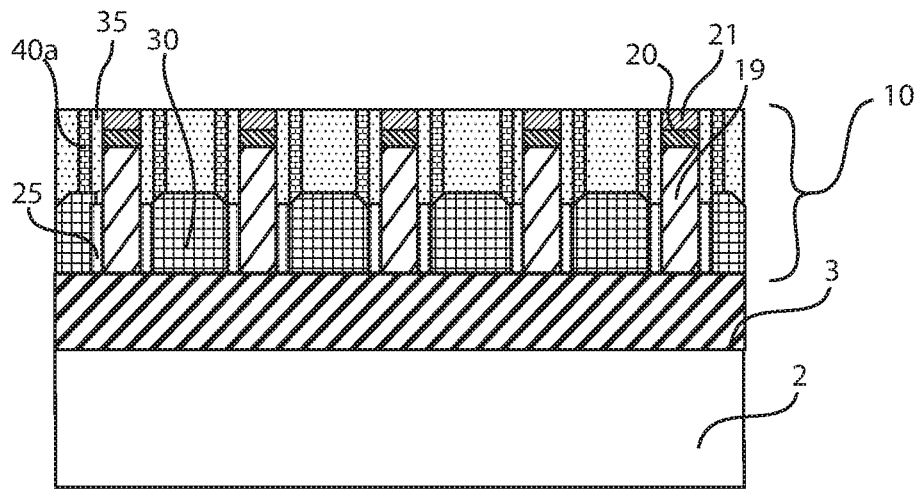
FIG. 8 is a side cross-sectional view depicting forming an oxide fill on the structure depicted in FIG. 7A, in accordance with one embodiment of the present disclosure.

FIG. 8 depicts one embodiment of forming a fill dielectric 45 on the structure depicted in FIG. 7A. The fill dielectric 45 may be selected from the group consisting of silicon-including materials such as $SiO_2$, SiN, $Si_3N_4$, $SiO_xN_y$, SiC, SiCO, SiCOH, and SiCH compounds; the above-mentioned silicon including materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). The fill dielectric 45 may be deposited using at least one of spinning from solution, spraying from solution, chemical vapor deposition (CVD), plasma enhanced CVD (PECVD), sputter deposition, reactive sputter deposition, ion-beam deposition, and evaporation. Following deposition of the fill dielectric 45, a planarization processes is conducted so that the upper surface of the fill dielectric 45 is coplanar with the upper surface of the replacement gate structure 10. The planarization of the dielectric material 45 may be provided by chemical mechanical planarization.

Figure 9:
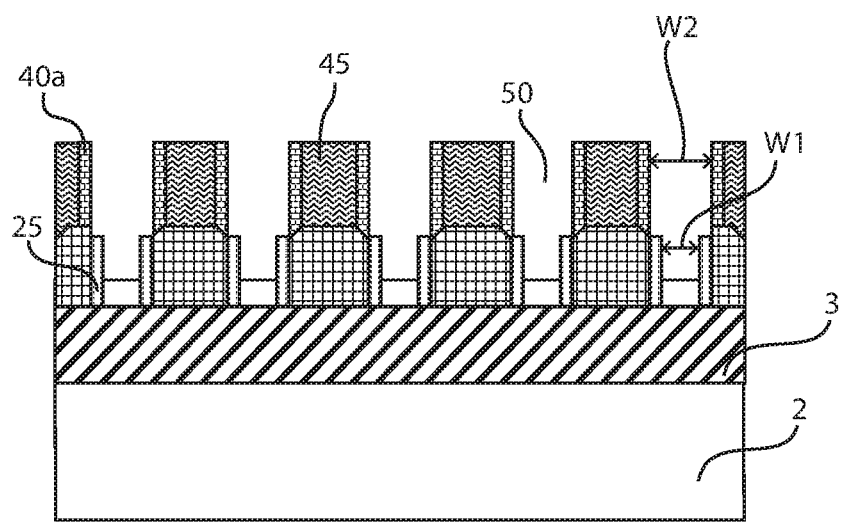
FIG. 9 is a side cross-sectional view depicting removing the replacement gate structure, in accordance with one embodiment of the present disclosure.

FIG. 9 depicts one embodiment of removing the replacement gate structure 10 to expose a channel region portion of the plurality of fin structures 15. In some embodiments, the replacement gate structure 10 may be removed by a selective etch process. The replacement gate structure 10 may be removed using a wet or dry etch process. In one embodiment, the replacement gate structure 10 is removed by reactive ion etch (RIE). In one example, an etch step for removing the replacement gate structure 10 can include an etch chemistry for removing the replacement gate structure 10 selective to the plurality of fin structures 15. Removing the replacement gate structure 10 forms a functional gate structure space 50 that leads to the channel portion of the fin structures 15.

In some embodiments, following removal of the replacement gate structure 10, the second spacer 35 may be removed. In some examples, the second spacer 35 may be removed by an etch process that is selective to at least the first spacer 25 and the third spacer 40a. The selective etch process for removing the second spacer 35 may also be selective to the fin structures 15 and the fill dielectric 45. Removing the second spacer 35 increases the opening width W2 of the functional gate structure space 50 at its opening relative to the width W1 of the functional gate structure space 50 at its base. For example, the width W2 of the opening to the gate structure space 50 may range from 5 nm to 25 nm, and the width W1 of the gate structure space 50 at its base may range from 2 nm to 15 nm. In another example, the width W2 of the opening to the gate structure space 50 may range from 10 nm to 20 nm, and the width W1 of the gate structure space 50 at its base may range from 5 nm to 10 nm. The geometry of the gate structure space 50 having a greater width at its opening W2 relative to its base W1 is referred to herein as a gate structure space 50 that is T-shaped.

A functional gate structure that is formed in the gate structure space 50 that is T-shaped is also referred to herein as being a T-shaped functional gate structure. A T-shaped functional gate structure having a small gate length that is provided by the narrow width of the base portion of the T-shaped gate structure, and having a relaxed critical dimension (CD) provided by a greater width at the upper portion of the T-shaped gate structure, provides an enhanced process window for work function metal chamfering process steps.

FIGS. 10-13 depict one embodiment for forming a functional gate structure 55 in the opening that is formed by removing the replacement gate structure. FIGS. 10-13 depict the gate electrode 60a, 60b of a functional gate structure being formed in a gate structure space 50 that is formed in accordance with the process flow depicted in FIGS. 1-9. The gate dielectric (not shown) for the functional gate structure can be formed prior to forming the gate electrode 60a, 60b, and is formed on the channel region portion of the fin structures 15. The gate dielectric may be a dielectric material, such as $SiO_2$, or alternatively high-k dielectrics, such as oxides of Hf, Ta, Zr, Al or combinations thereof. In another embodiment, the at least one gate dielectric is comprised of an oxide, such as $SiO_2$ or $HfO_2$. The gate electrode 60a, 60b is formed within the gate structure space 50 atop the gate dielectric.

In the embodiments depicted in FIGS. 10-13, a gate electrode 60a having a combination of work function metals for providing a n-type FinFET is depicted being formed on one fin structure, and a gate electrode 60b having a combination of work function metals for providing a p-type FinFET is depicted being formed on a second fin structure. In the embodiments described with reference to FIGS. 10-13, the gate electrode 60a for the n-type FinFET may be composed of a titanium and carbon containing layer 61a, e.g., titanium carbide (TiC) layer, being formed on the gate dielectric; a titanium and nitride containing layer 62a, e.g., titanium nitride (TiN), being formed on titanium and carbon containing layer 61a; and a metal fill 63a, e.g., tungsten (W) fill, being formed on the titanium and nitride containing layer 62a. In the embodiments described with reference to FIGS. 10-13, the gate electrode 60b for the p-type FinFET may be composed of a titanium and nitrogen containing layer 62b, e.g., titanium nitride (TiN) layer, being formed on the gate dielectric; and a metal fill 63b, e.g., tungsten (W) fill, being formed on the titanium and nitride containing layer 62b.

Figure 10:
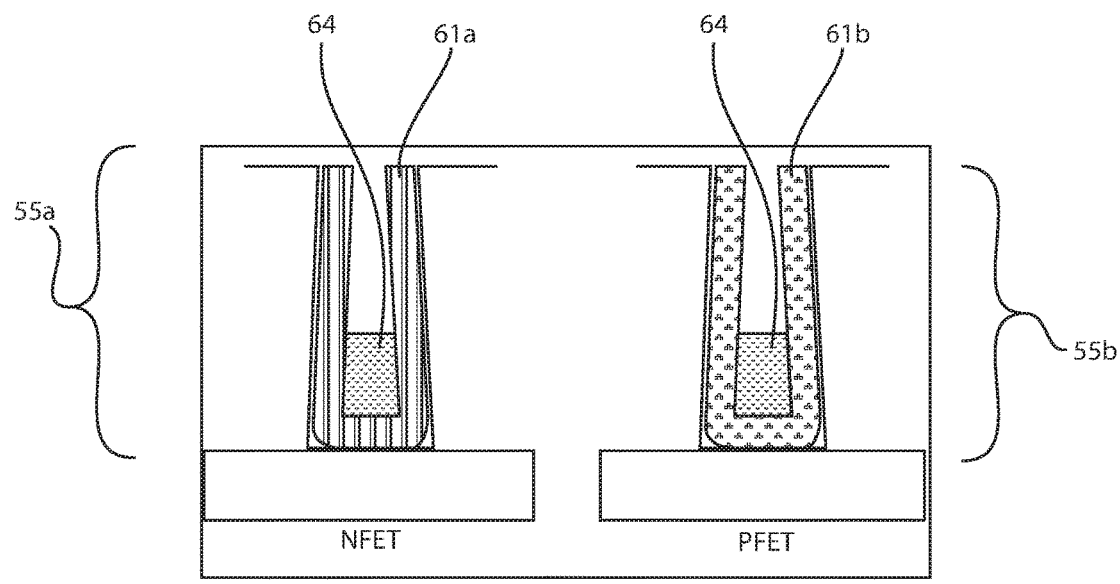
FIG. 10 is a side cross-sectional view depicting forming a titanium and carbon containing layer and an organic dielectric layer (ODL) in the gate region for an n-type FinFET and a p-type FinFET.

FIG. 10 depicts one embodiment of forming a titanium and carbon containing layer 61a, 61b, e.g., titanium carbide (TiC), and an organic dielectric layer (ODL) 64 in the gate structure space 50 for an n-type FinFET and a p-type FinFET. The titanium and carbon containing layer 61a, 61b, e.g., titanium carbide (TiC) layer, may be deposited within the gate structure space 50 on the gate dielectric at the base of the opening using atomic layer deposition. The titanium and carbon containing layer 61a, 61b, e.g., titanium carbide (TiC) layer, is typically deposited as a conformal layer and may be formed directly on the sidewalls of the gate structure space 50 that is provided by the first spacer 25 and the third spacer 40a, 40b. In one embodiment, the thickness of the titanium and carbon containing layer 61a, 61b may range from 3 nm to 10 nm. In another example, the thickness of the titanium and carbon containing layer 61a, 61b may range from 5 nm to 8 nm. The titanium and carbon containing layer 61a, 61b may be deposited using atomic layer deposition (ALD). The organic dielectric layer 64 may be deposited using a spin on dielectric method, or may alternatively be deposited using chemical vapor deposition. The organic dielectric layer 64 is typically deposited to fill the lower portion of the gate structure space 50. In some embodiments, the organic dielectric layer 64 may be recessed within the gate structure space 50 using an etch process.

Figure 11:
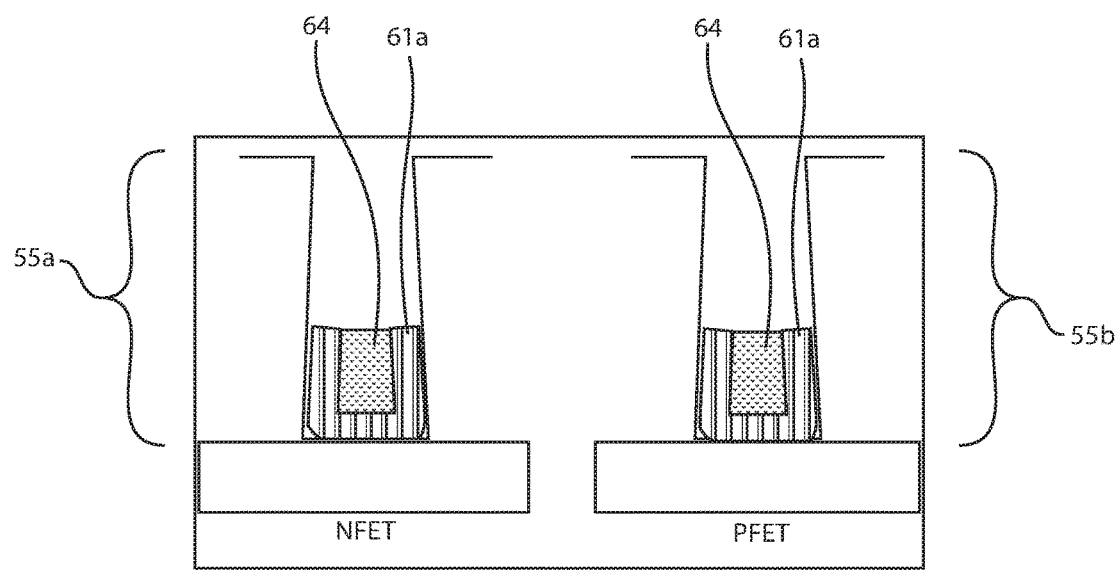
FIG. 11 is a side cross-sectional view depicting recessing the titanium and carbon containing layer in the gate region of the n-type FinFET and the p-type FinFET, in accordance with one embodiment of the present disclosure.

FIG. 11 depicts recessing the titanium and carbon containing layer 61a, 61b in the gate structure space 50 of the n-type FinFET and the p-type FinFET. The titanium and carbon containing layers 61a, 61b may be recessed so that the upper surface of the titanium and carbon containing layers 61a, 61b are substantially coplanar with the upper surface of the organic dielectric layer 64 that are present in the lower portion of the gate structure space 50.

Figure 12:
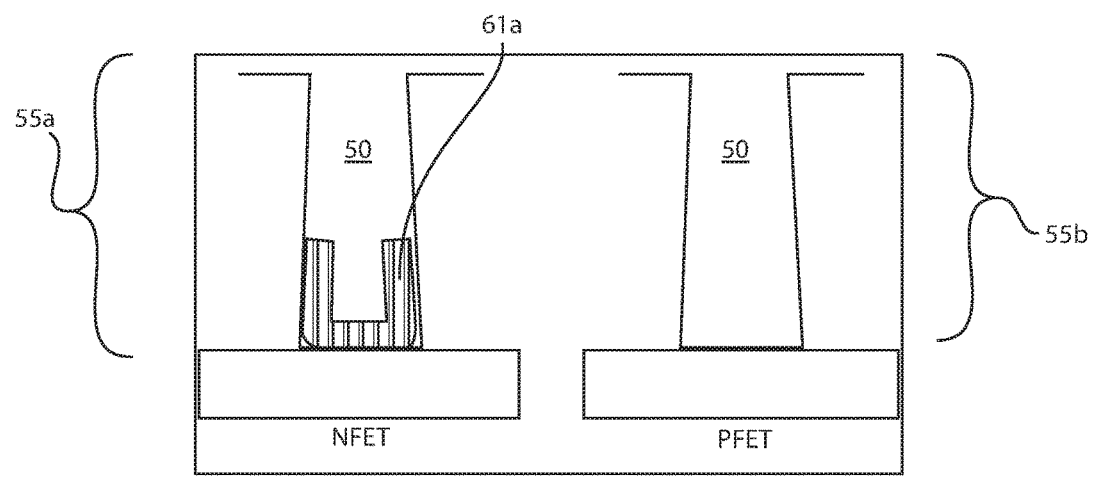
FIG. 12 is a side cross-sectional view depicting removing the titanium and carbon containing layer from the gate region of the p-type FinFET, in accordance of one embodiment of the present disclosure.

FIG. 12 depicting removing the titanium and carbon containing layer from the gate region of the p-type FinFET. During this process step, the organic dielectric layer 64 is removed from the gate structure space 50 of both the n-type FinFET and the p-type FinFET. In some embodiments, an etch mask, e.g., photoresist mask, may be formed over the titanium and carbon containing layer 61a that is present in then n-type FinFET portion of the substrate, which the titanium and carbon containing layer 61b is removed from the p-type FinFET portion of the substrate.

Figure 13:
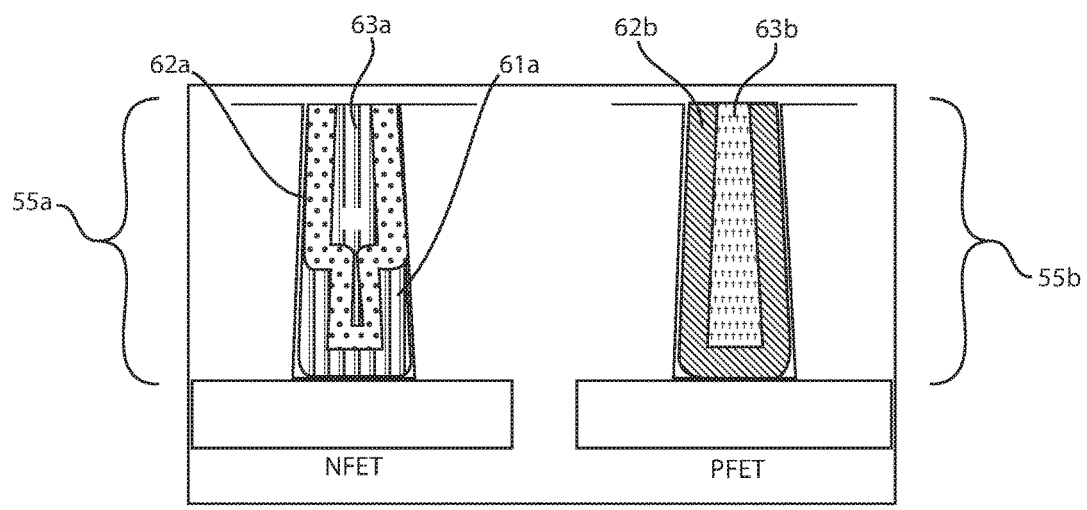
FIG. 13 is a side cross-sectional view depicting forming a titanium and nitrogen containing layer in the gate region of the n-type FinFET and the p-type FinFET, and forming a tungsten containing fill in the gate region of the n-type FinFET and the p-type FinFET, in accordance with embodiment of the present disclosure.

FIG. 13 depicting forming a titanium and nitrogen containing layer 62a, 62b, e.g., titanium nitride (TiN) layer, in the gate region of the n-type FinFET and the p-type FinFET, and forming a tungsten containing fill 63, e.g., tungsten (W) fill, in the gate region of the n-type FinFET and the p-type FinFET. The titanium and nitrogen containing layer 62a, 62b, e.g., titanium nitride (TiN) layer, is typically deposited as a conformal layer and may be formed directly on the sidewalls of the gate structure space 50 that is provided by the first spacer 25 and the third spacer 40a, 40b. For the p-type FinFET the titanium and nitrogen containing layer 62b may be deposited into direct contact with the gate dielectric that is within the gate structure space 50. For the n-type FinFET, the titanium and nitrogen containing layer 62a may be deposited to fill the opening between the vertical portions of the titanium and carbon containing layer 61a. In one embodiment, the thickness of the titanium and nitrogen containing layer 62a, 62b may range from 3 nm to 10 nm. In another example, the thickness of the titanium and nitrogen containing layer 62a, 62b may range from 5 nm to 8 nm. Following the formation of the titanium and nitrogen containing layer 62a, 62b, the tungsten containing fill 63, e.g., tungsten (W) fill, is deposited in the gate region of the n-type FinFET and the p-type FinFET. The tungsten containing fill 63 may be deposited using plating.

Figure 14:
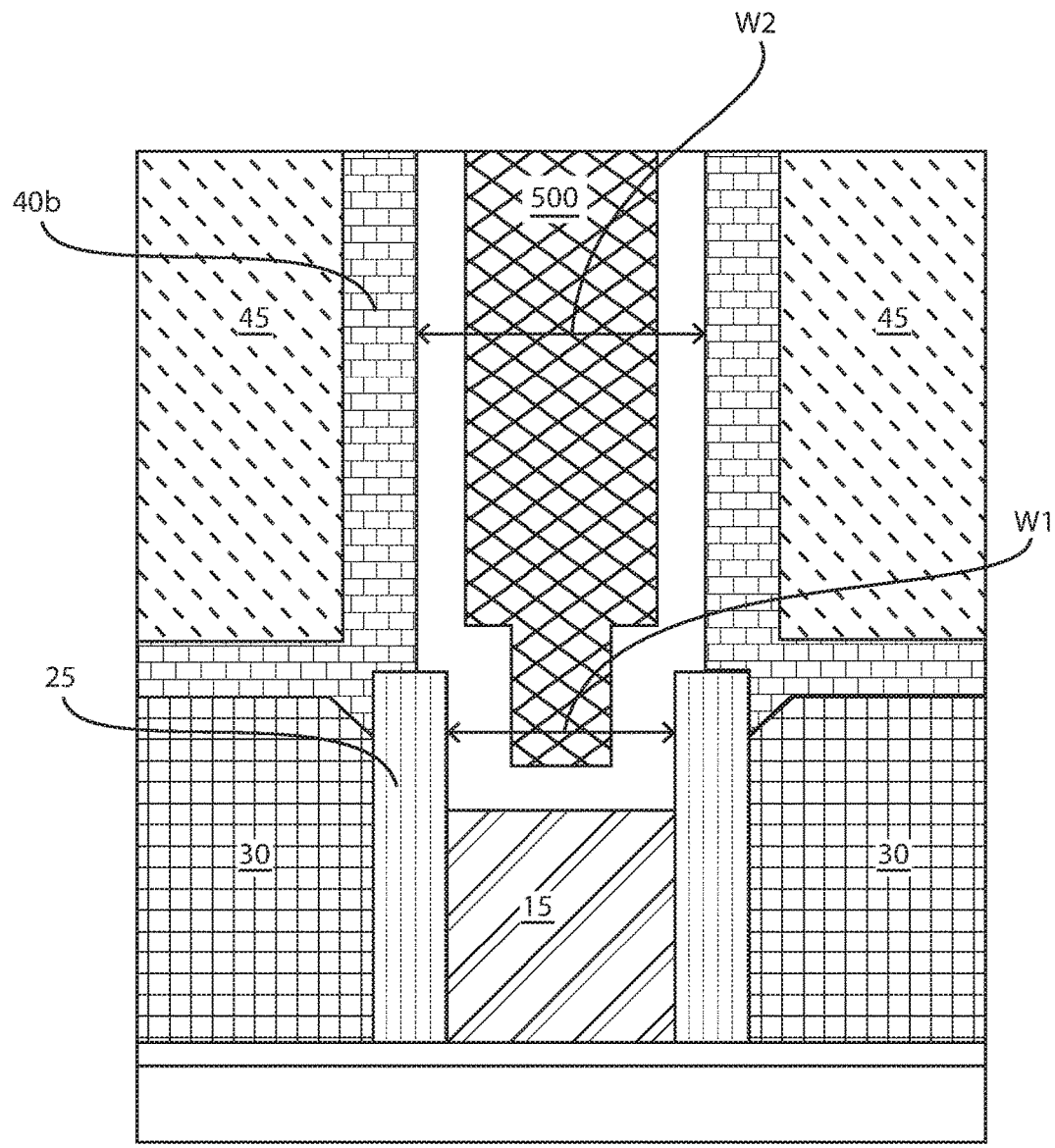
FIG. 14 is a side cross-sectional view of a gate structure, in accordance with one embodiment of the present disclosure.

FIG. 14 depicts one embodiment of a semiconductor device in accordance with the present disclosure. In some embodiments, the semiconductor device depicted in FIG. 14 may be a FinFET. FIG. 14 depicts a semiconductor device that includes a gate structure 500 present on a channel portion of a fin structure 15, the gate structure 500 including a first portion with a first width W1 present on a gate dielectric (not shown), and a second portion with a second width W2 present on the first portion, in which the second width W2 is greater than the first width W1. The semiconductor device, e.g., FinFET, may further include a composite spacer 25, 40b including a first portion 25 of a first material in contact with the first portion of the gate structure, and a second portion 40b of a second material in contact with the second portion of the gate structure.

In some embodiments, the first width W1 of the first width portion of the gate structure ranges from 15 nm to 20 nm, and the second width W2 of the second width portion of the gate structure ranges from 20 nm to 30 nm. In some embodiments, the first material 25 of the composite spacer comprises a silicon boron carbon nitride (SiBCN) material, and the second material 140b of the composite spacer may be composed of a nitride, such as silicon nitride. The fill portion 45 of the second spacer is comprised of a oxide, such as silicon oxide.

The gate structure 500 depicted in FIG. 14 include the gate electrode 55a of an n-type FinFET as depicted in FIG. 13, or may include the gate electrode 55b of the p-type FinFET as depicted in FIG. 13.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
a gate structure present on a channel portion of a fin structure, the gate structure including a material stack of a titanium and carbon layer having a single U-shaped geometry on a gate dielectric, a titanium and nitrogen layer having a dual U-shaped geometry present on the titanium and carbon layer, wherein a lower U-shaped geometry portion fills an opening in the single U-shaped geometry of the titanium and carbon layer, an upper U-shaped geometry portion of the titanium and nitrogen layer having a greater with than the lower U-shaped geometry portion, and a tungsten containing fill present on the titanium and nitrogen layer; and
a composite spacer including a first portion of a first material a second portion of a second material in contact with the second portion of the gate structure.

2. The semiconductor device of claim 1, wherein first material comprises silicon boron carbon nitride (SiBCN).

3. The semiconductor device of claim 1, wherein the second portion of the composite spacer comprises a conformal portion and a fill portion.

4. The semiconductor device of claim 3, wherein the conformal portion of the second spacer is comprised of an oxide.

5. The semiconductor device of claim 4, wherein the fill portion of the second spacer is comprised of a nitride.

6. A semiconductor device comprising:
a gate structure present on a channel portion of a fin structure, the gate structure including a material stack of a titanium and carbon layer having a single U-shaped geometry on a gate dielectric, a titanium and nitrogen layer having a dual U-shaped geometry present on the titanium and carbon layer, wherein a lower U-shaped geometry portion fills an opening in the single U-shaped geometry of the titanium and carbon layer, an upper U-shaped geometry portion of the titanium and nitrogen layer having a greater with than the lower U-shaped geometry portion, and a tungsten containing fill present on the titanium and nitrogen layer; and
a composite spacer including a first portion of a first material comprising silicon boron carbon nitride (SiBCN), and a second portion of a second material in contact with the second portion of the gate structure.

7. The semiconductor device of claim 6, wherein the second portion of the composite spacer comprises a conformal portion and a fill portion.

8. The semiconductor device of claim 7, wherein the conformal portion of the second spacer is comprised of an oxide.

9. The semiconductor device of claim 8, wherein the fill portion of the second spacer is comprised of a nitride.

10. A semiconductor device comprising:
a gate structure present on a channel portion of a fin structure, the gate structure including a first portion with a first width present on a gate dielectric, and a second portion with a second width present on the first portion, in which the second width is greater than the first width, wherein a material stack of a titanium and carbon layer having a single U-shaped geometry on a gate dielectric, a titanium and nitrogen layer having a dual U-shaped geometry present on the titanium and carbon layer, wherein a lower U-shaped geometry portion fills an opening in the single U-shaped geometry of the titanium and carbon layer, an upper U-shaped geometry portion of the titanium and nitrogen layer having a greater with than the lower U-shaped geometry portion, and a tungsten containing fill present on the titanium and nitrogen layer; and
a composite spacer including a first portion of a first material comprising silicon boron carbon nitride (SiBCN) in contact with the first spacer portion of the gate structure, and a second portion of a second material in contact with the second spacer portion of the gate structure, wherein the second spacer portion includes a conformal layer component and a fill component.

11. The semiconductor device of claim 10, wherein the conformal component of the second spacer portion is comprised of an oxide.

12. The semiconductor device of claim 11, wherein the oxide of the second spacer portion is composed of silicon oxide.

13. The semiconductor device of claim 10, wherein the fill portion of the second spacer is comprised of a nitride.

14. The semiconductor device of claim 13, wherein the nitride of the fill portion is composed of silicon nitride.

* * * * *